(12) United States Patent
Liao et al.

(10) Patent No.: US 7,112,066 B2
(45) Date of Patent: Sep. 26, 2006

(54) ELECTRICAL CONNECTOR ASSEMBLY WITH PICK UP CAP

(75) Inventors: Fang-Jwu Liao, Tu-chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 144 days.

(21) Appl. No.: 10/892,609

(22) Filed: Jul. 15, 2004

(65) Prior Publication Data

US 2005/0090136 A1    Apr. 28, 2005

(30) Foreign Application Priority Data

Oct. 24, 2003    (TW) ............................... 92218920 U

(51) Int. Cl.
*H01R 13/60*    (2006.01)
(52) U.S. Cl. ........................................ 439/41; 439/940
(58) Field of Classification Search .................. 439/41, 439/42, 135, 940
See application file for complete search history.

(56) References Cited

U.S. PATENT DOCUMENTS

| 4,560,216 A | * | 12/1985 | Egawa ........................ 439/41 |
| 4,916,805 A | | 4/1990 | Ellrich et al. |
| 5,615,477 A | | 4/1997 | Sweitzer |
| 6,478,588 B1 | | 11/2002 | Howell et al. |

* cited by examiner

*Primary Examiner*—Khiem Nguyen
(74) *Attorney, Agent, or Firm*—Wei Te Chung

(57) ABSTRACT

An electrical connector assembly (1) includes an LGA connector (2) and a pick up cap (3) mounted onto the connector. The connector defines a number of cells (26) for receiving a corresponding number of contacts (22). The pick up cap has a planar body (31) forming a plane top surface (300), which can be sucked by a vacuum suction device to move the connector assembly to a desired location on a PCB, and a bottom surface (301) opposite to the top surface. Several elongate passages (34) are defined in and through the planar body. Each passage extends aslant from the top surface to the bottom surface thereby preventing the contacts from dust. When curing adhesive film at high temperature, heated air can flow quickly through the passages and the cells to a bottom portion of the connector and reliable electrical connection between the contacts and the PCB are subsequently produced.

18 Claims, 5 Drawing Sheets

ELECTRICAL CONNECTOR ASSEMBLY WITH PICK UP CAP

BACKGROUND OF THE INVENTION

1. Field of the Invention

The invention is related to an electrical connector assembly which comprised an electrical connector and a pick up cap, the pick up cap being mounted to the connector for providing a flat top surface to be engaged by a vacuum suction device, whereby the connector can be moved onto a circuit substrate such as a printed circuit board (PCB) on which the connector is to be mounted.

2. Description of the Prior Art

At present, on many production lines of the electrical industry, electronic components such as electrical connectors are mounted onto circuit substrates such as printed circuit boards (PCBs) by surface mount technology (SMT), as disclosed in U.S. Pat. Nos. 5,615,477 and 4,916,805.

A method of mounting an electrical connector onto a PCB by SMT generally comprises a sequence of the following steps A through F:

- A—Application of an adhesive film on the PCB having a plurality of metal contact pads. The application of the adhesive film may be performed by screen printing, pin transfer, or from a dispenser onto predetermined areas of the PCB.
- B—Activation of the adhesive film by irradiation with actinic light in the ultraviolet (UV) or visible wavelength range between 200 and 600 nm, to a degree and for a period of time such that a desired initial tackiness is produced.
- C—Mounting the connector with its contacts on the activated adhesive film and the metal contact pads of the PCB, respectively.
- D—Curing the adhesive film at a temperature between 60~140° C.; for example, in a convection cabinet, using infrared radiant heaters or by means of the actinic radiation source used in step B if such source also produces infrared radiation.
- E—Producing electrical engagement between the contacts of the connector and the corresponding metal contact pads of the PCB by soldering in a wave solder machine or in drag soldering equipment;
- F—Cooling the assembly to room temperature.

In step C, the connector is accurately positioned on the PCB by a vacuum suction device. Generally, a typical connector has a multiplicity of holes in a flat top portion thereof. Thus the connector does not have a suitably smooth, integral top surface for engagement by a vacuum suction device. Typically, a pick up cap is attached on the top portion of the connector to provide the required plane top surface, as disclosed in U.S. Pat. No. 6,478,588.

Referring to FIG. 5, there is shown an assembled and isometric view of a conventional electrical connector 8 and a convention pick up cap 9 mounted onto the connector 8. The connector 8 comprises a frame 81, an insulative housing 84 received in the frame 81, a load plate 82 mounted on an end of the frame 81, and an operation member 83 mounted on an opposite end of the frame 81 and capable of engaging with the load plate 82. The housing 84 defines a number of cells (not shown) therethrough, the cells receiving a corresponding number of electrical contacts (not shown). The contacts are soldered onto a PCB (not shown) with electrically connecting with a plurality of metal contact pads formed on the PCB. The pick up cap 9 has a planar body 91 with an integrated smooth top surface and four latches 92 extending downwardly from the planar body 91. The latches 92 clasp the connector 8 to mount the pick up cap 9 onto the connector 8. A vacuum suction device (not shown) can engage the top surface of the pick up cap 9 to move the connector 8 to a desired location on the PCB. Then the connector 8 can be heated and soldered onto the PCB.

However, the pick up cap 9, the frame 81 and the load plate 82 cover the housing 84. When curing the adhesive film at a high temperature in a convection cabinet using infrared radiant heaters, heated air can only flow through a gap between the pick up cap 9 and the connector 8 and the cells of the housing 84 to a bottom portion of the housing 84. Generally, the time needed for curing the adhesive film is short. Thus, the adhesive film is liable to cure non-uniformly. When this happens, electrical engagement between some of the contacts and the corresponding metal contact pads of the PCB may be flawed. The connector 8 may not reliably electrically connect with the PCB. Additionally, when cooling the entire assembly to room temperature, heated air can only be dissipated out through the gap between the pick up cap 9 and the connector 8. This increases the time needed for cooling the assembly, which reduces the efficiency of mounting of the connector 8 onto the PCB.

Referring to FIG. 6, for settling the above-mentioned problems, another conventional pick up cap 6 is provided. The pick up cap 6 has four generally rectangular holes 60 extending through the planar body 61 in a vertical direction thereof. When curing the adhesive film at high temperature in a convection cabinet using infrared radiant heaters, heated air can flow through the holes 60 and get to a bottom of the connector 8 quickly. Therefore, the connector 8 can be reliably electrically soldered onto the PCB in a short time, and the efficiency of mounting of the connector 8 onto the PCB is improved. However, a new problem appears because of the holes 60 in the pick up cap 6. Dust is liable to adhere to the contacts of the connector 8 through the holes 60, which effects performance of the contacts.

In view of the above, a new pick up cap that overcomes the above-mentioned disadvantages is desired.

SUMMARY OF THE INVENTION

An object of the invention is to provide an electrical connector assembly comprising an electrical connector having a number of electrical contacts and a pick up cap, wherein the pick up cap facilitates soldering the connector onto a printed circuit board (PCB) reliably and preventing the contacts from side-effecting by outside small dirty material.

To achieve the above-mentioned object, an electrical connector assembly in accordance with a preferred embodiment of the present invention is provide. The connector assembly comprises a land grid array (LGA) connector and a pick up cap mounted onto the connector. The connector defines a number of cells for receiving a corresponding number of contacts. The pick up cap has a planar body forming a plane top surface, which can be sucked by a vacuum suction device to move the connector assembly to a desired location on a PCB, and a bottom surface opposite to the top surface. Several elongate passages are defined in and through the planar body. Each passage extends aslant from the top surface to the bottom surface thereby preventing the contacts from being polluted by dust. When curing adhesive film at high temperature, heated air can flow quickly through the passages and the cells to a bottom portion of the connector and reliable electrical connection between the contacts and the PCB is subsequently produced.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the invention in detail.

Figure 1:
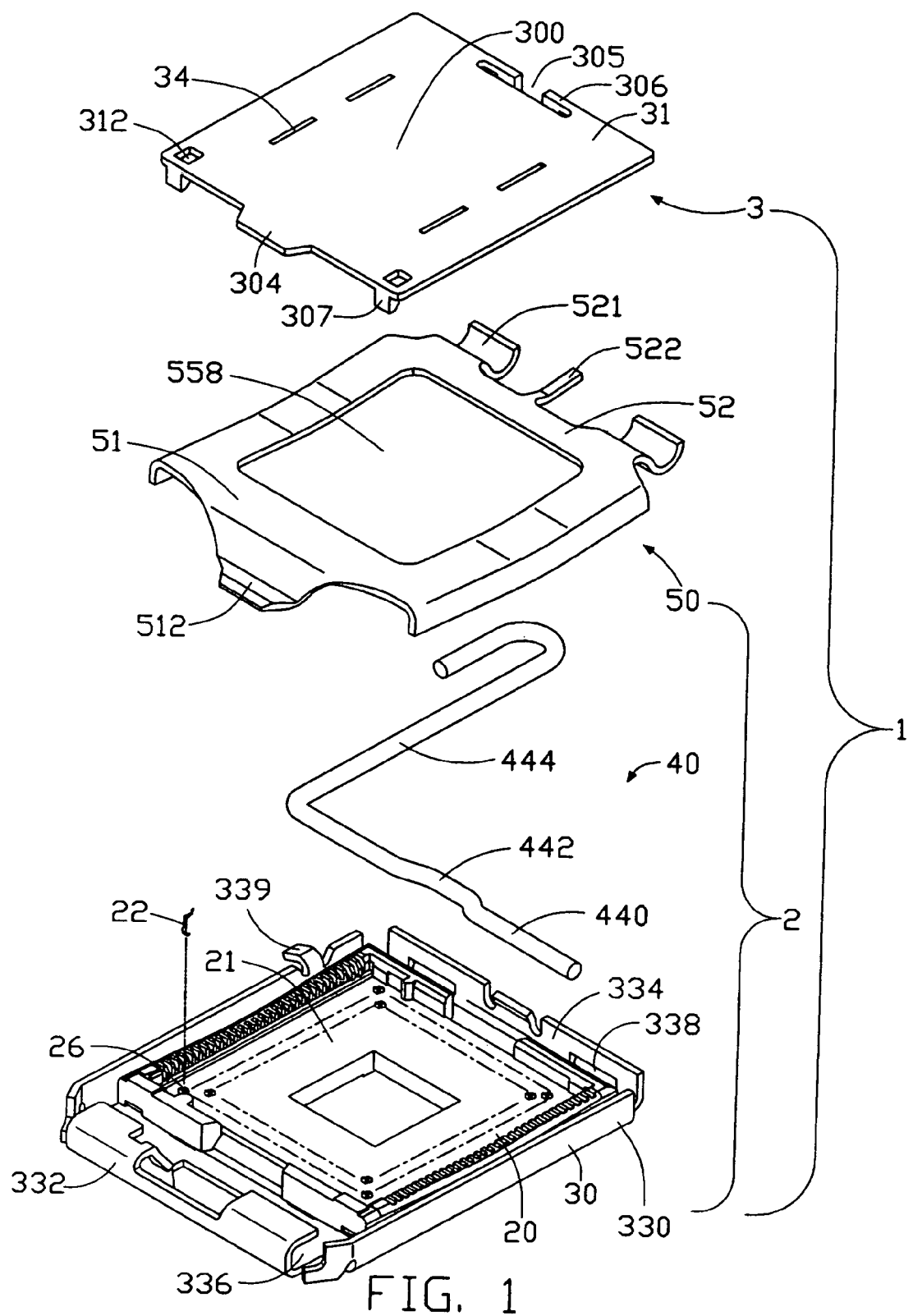
FIG. 1 is an exploded, isometric view of an electrical connector assembly in accordance with the preferred embodiment of the present invention, wherein the connector assembly comprises a land grid array (LGA) connector and a pick up cap.

FIG. 1 is an exploded, isometric view of an electrical connector assembly 1 in accordance with the preferred embodiment of the present invention. The connector assembly 1 comprises a land grid array (LGA) connector 2 and a generally rectangular pick up cap 3. The pick up cap 3 is mounted onto the connector 2, for providing a plane top surface to be engaged by a vacuum suction device (not shown). The connector assembly 1 can thereby be moved onto a circuit substrate, such as a printed circuit board (PCB) (not shown), on which the connector 2 is to be mounted.

The connector 2 comprises a generally rectangular insulative housing 20, a plurality of electrical contacts 22 received in the housing 20, a frame 30 partly covering and reinforcing the housing 20, an operation member 40 pivotably received in an end of the frame 30, and a load plate 50 pivotably mounted to an opposite end of the frame 30 for engaging with the operation member 40.

The housing 20 defines a generally rectangular cavity 21 in a middle thereof. The cavity 21 is used for receiving an electronic package such as an LGA central processing unit (CPU) (not shown) therein. A multiplicity of cells 26 is defined in a portion of the housing 20 under the cavity 21, the cells 26 receiving a corresponding number of the contacts 22 therein respectively. The frame 30 comprises a pair of lateral sides 330 each having an L-shaped cross-section, a front end 332 having a U-shaped cross-section, and a rear end 334 having an L-shaped cross-section. The housing 20 is fittingly received in the frame 30. An elongate chamber 336 is defined in the front end 332 of the frame 30. A pair of spaced slots 338 is defined in the rear end 334 of the frame 30. An ear 339 extends arcuately from an edge of one of the lateral sides 330 of the frame 30. The operation member 40 comprises a pair of locating portions 440 pivotably received in the chamber 336 of the frame 30, an offset actuating portion 442 between the locating portions 440, and an operating portion 444 extending perpendicularly from an end of one of the locating portions 440. The operating portion 444 is disposed outside of the frame 30. When oriented at a horizontal position parallel to a top face of the housing 20, the operating portion 444 engages with the ear 339. The load plate 50 comprises a pair of parallel arcuate sides 256. A generally rectangular window 558 is defined in a middle of the load plate 50. An engaging portion 512 extends arcuately from a front end 51 of the load plate 50. A pair of spaced securing portions 521 extends arcuately from an opposite rear end 52 of the load plate 50, the securing portions 521 being pivotably received in the slots 338 of the frame 30. A tail 522 extends from the rear end of the load plate 50, between the securing portions 521. When the load plate 50 is oriented at a horizontal position parallel to the top face of the housing 20, the engaging portion 512 of the load plate 50 is engaged by the actuating portion 442 of the operation member 40, with the load plate 50 thereby pressing the CPU on the contacts 22. When the load plate 50 is oriented at a position perpendicular to the top face of the housing 20, the tail 522 abuts against the frame 30 to prevent the load plate 50 from over-rotating.

Figure 3:
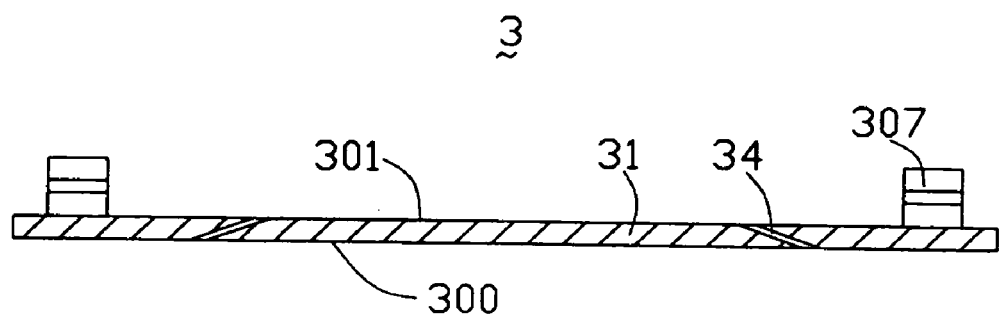
FIG. 3 is a cross-sectional view taken along III—III line of FIG. 2.

The pick up cap 3 has a generally rectangular planar body 31. The planar body 31 comprises a plane top surface 300, and a bottom surface 301 opposite to the top surface 300. Two pairs of parallel passages 34 are defined in two opposite sides of the planar body 31. Also referring to FIG. 3, each passage 34 is elongate and extends aslant from the top surface 300 to the bottom surface, thereby preventing the contact 22 from being polluted by dust. A trapezoidal lip 304 is formed at a middle of the front end of the planar body 31. A generally T-shaped channel 305 is defined in a middle of the rear end of the planar body 31, thereby forming a pair of opposing arms 306.

Figure 2:
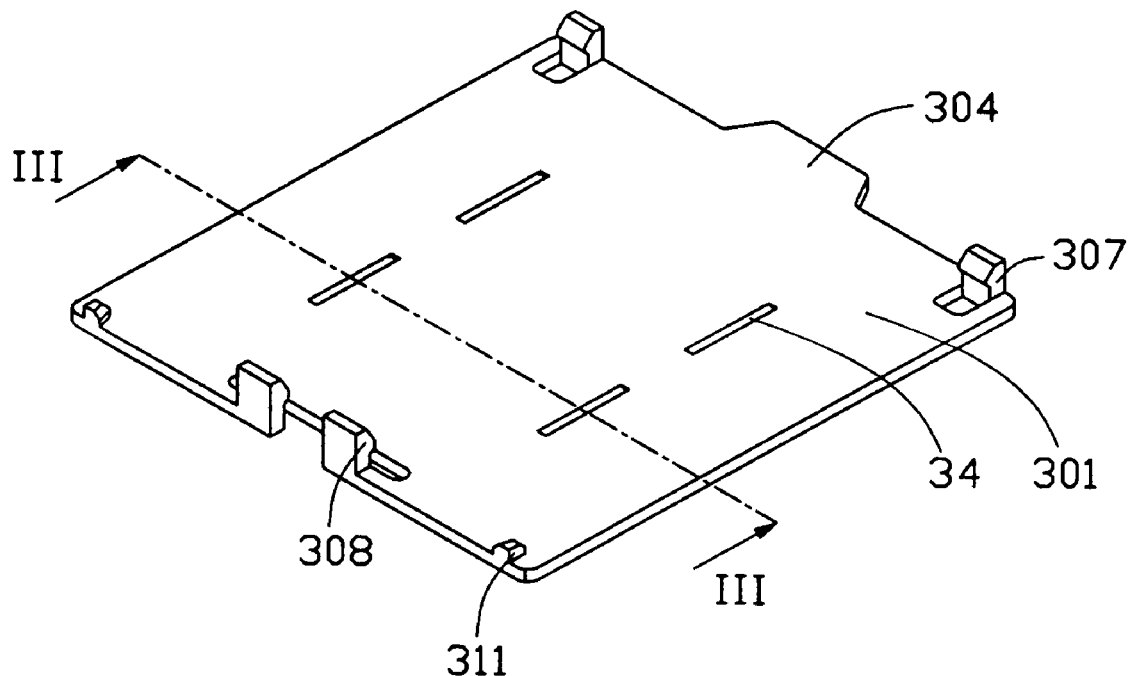
FIG. 2 is an isometric view of the pick up cap of FIG. 1, showing the pick up cap inverted.

FIG. 2 is an isometric view of the pick up cap 3 inverted. A pair of first latches 307 is formed at opposite sides of the front end of the planar body 31 respectively. The first latches 307 depend from the bottom surface 301 of the planar body 31. A through opening 312 is defined in a portion of the planar body 31 adjacent a rear of each first latch 307, thereby increasing a resilience of the first latch 307. A pair of second latches 308 is formed at the rear end of the planar body 31. The second latches 308 depend from free ends of the arms 306 respectively. A pair of protrusions 311 is formed at opposite sides of the rear end of the planar body 31 respectively. The protrusions 311 depend from the bottom surface 301, near corresponding corners of the planar body 31.

Figure 4:
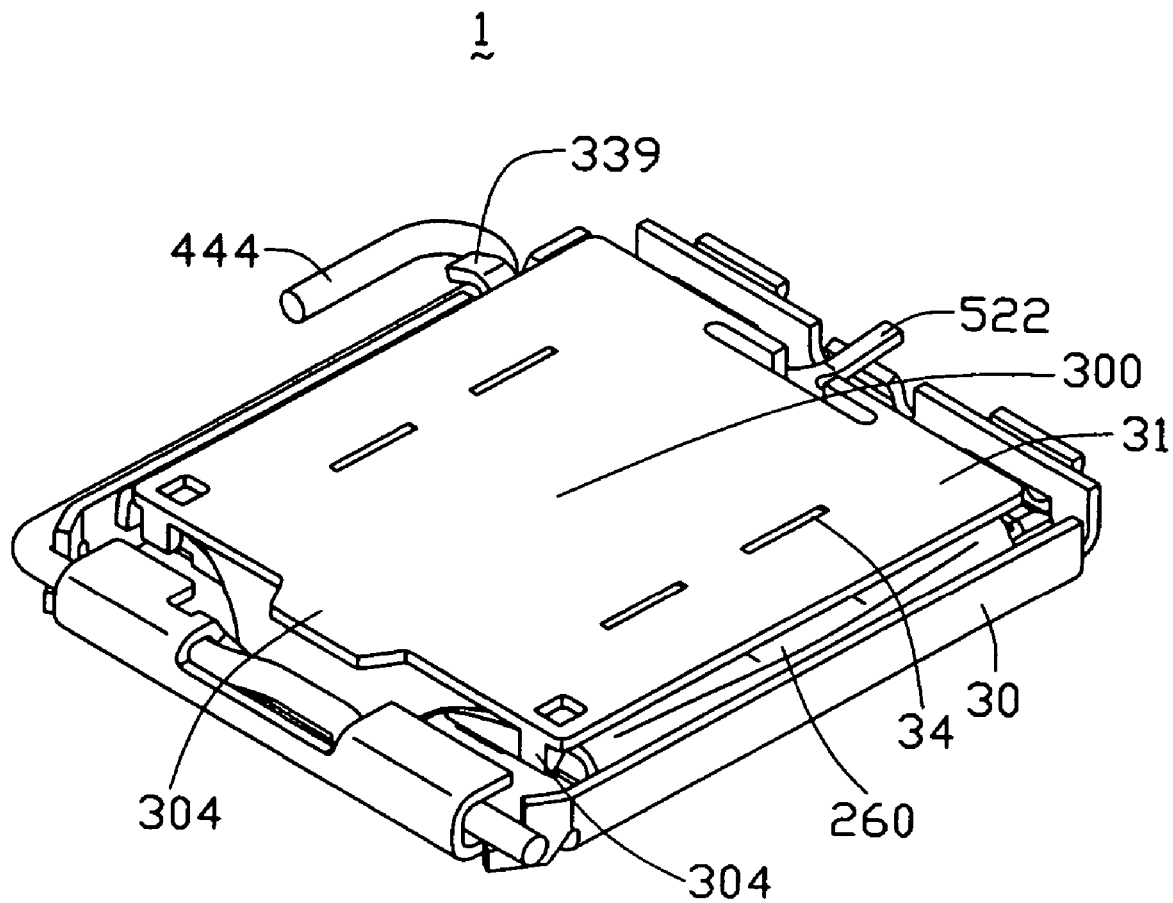
FIG. 4 is an assembled, isometric view of the connector assembly of FIG. 1.
Figure 5:
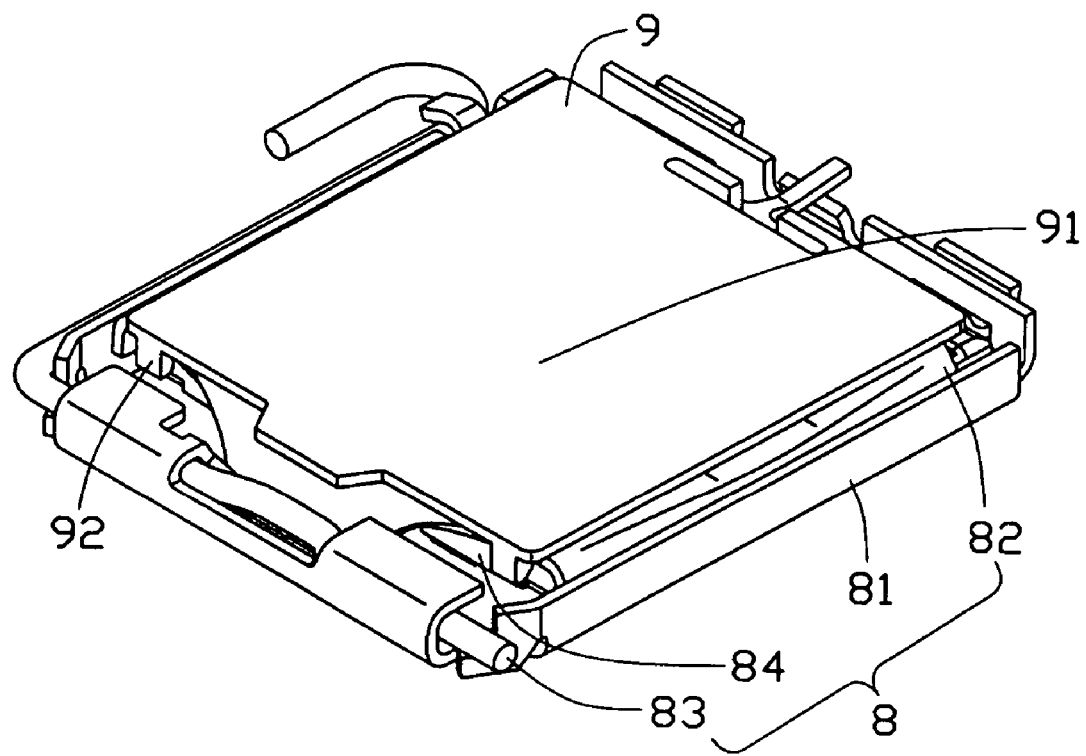
FIG. 5 is an assembled, isometric view of a conventional electrical connector and a conventional pick up cap.
Figure 6:
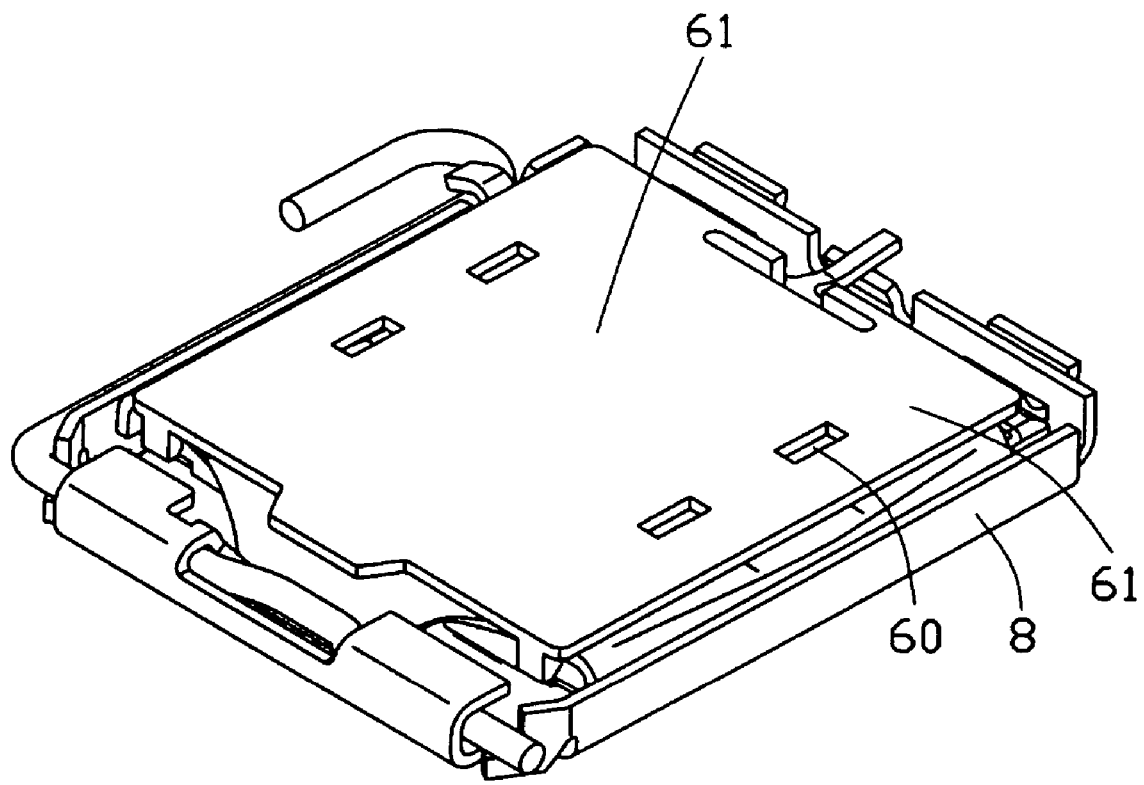
FIG. 6 is an assembled, isometric view of the connector of FIG. 5 and another conventional pick up cap.

Referring to FIG. 4, in attachment of the pick up cap 3 onto the connector 2, the pick up cap 3 is disposed over the connector 2, with the first and second latches 307, 308 loosely contacting corresponding front and rear edges of the load plate 50 respectively. The pick up cap 3 is pressed down. The first latches 307 and second latches 308 are elastically deflected outwardly, and snappingly clasp the front and rear edges of the load plate 50. Simultaneously, the protrusions 311 abut against the rear edge of the load plate 50. The pick up cap 3 is thereby securely mounted onto the connector 2. The channel 305 receives the tail 522 of the load plate 50. FIG. 4 is an assembled, side elevation view of the pick up cap 3 and the load plate 50. A gap 260 is defined between the bottom surface 301 of the pick up cap 3 and the arcuate sides 256 of the load plate 50. The passages 34 are in communication with the window 558 of the load plate 50 and the cells 26 of the housing 20. In this position, a vacuum suction device (not shown) can reliably engage a middle portion of the top surface 300 of the pick up cap 3. The connector assembly 1 can thus be moved to a desired location on the PCB, with the contacts 22 of the connector 2 engaging on an activated adhesive film and metal contact pads of the PCB.

The adhesive film is cured at a high temperature in a convection cabinet using infrared radiant heaters. Heated air can flow not only through the gap 260, but also through the passages of the pick up cap 3, the window 558 of the load plate 50, and the cells 212 of the housing 20. Thus much heated air can quickly flow to a bottom portion of the connector 2, and quickly and uniformly cure the adhesive film. Accordingly, when the entire assembly is subsequently processed in a wave solder machine or drag soldering equipment, reliable electrical connection between the contacts 22 of the connector 2 and the metal contact pads of the PCB is produced. Furthermore, when said entire assembly is cooled, heated air can be quickly dissipated out through the passages of the pick up cap 3. That is, said entire assembly can be quickly cooled. The efficiency of mounting of the connector 2 onto the PCB is thereby enhanced.

In the above-described embodiment, two pairs of parallel elongate passages 34 are defined in and through the planar body 31 of the pick up cap 3. It should be understood that the numbers, shapes, sizes and locations of the passages 34 may be varied, as long as each of the passages 34 extends aslant from the top surface 300 to the bottom surface 301 of planar body 31. For example, each of the passages 34 may be triangular, trapezoidal or circular. Additionally, the passages 34 may have different shapes from each other. Furthermore, two or all of the passages 34 may have the same size. The numbers, shapes, sizes and locations of the passages 34 can be configured according to the requirements of each particular application. In brief, any ventilation passage with a configuration of a non-vertical straight line type including an oblique type, a deflection type, or a serpentine type for preventing invasion of the dust is the object of the invention.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed is:

1. An electrical connector assembly comprising:
    an electrical connector adapted for being mounted onto a circuit substrate by surface mount technology (SMT), the connector comprising:
    an insulative housing defining a plurality of cells; and
    a plurality of electrical contacts received in corresponding cells respectively; and
    a pick up cap engagingly mounted to a top portion of the connector, the pick up cap having a planar body, the planar body having a plane top surface capable of being engaged by a vacuum suction device and a bottom surface, and at least one passage defined in and through the planar body, said at least one passage extending aslant from the top surface to the bottom surface thereby permitting heated air to flow therethrough during mounting the connector assembly onto the circuit substrate by SMT while preventing the contacts from dust;
    wherein the connector includes a load plate having a generally rectangular window in a middle thereof;
    wherein when the pick up cap is mounted on the top portion of the connector, the passages are in communication with the window of the clip and the cells of the housing.

2. The electrical connector assembly as claimed in claim 1, wherein there are four elongate passages defined in the planar body.

3. The electrical connector assembly as claimed in claim 1, wherein a pair of latches is formed at opposite sides of a front end of the pick up cap, the latches depending from the bottom surface and snappingly clasping a corresponding edge of the load plate of the connector.

4. The electrical connector assembly as claimed in claim 1, wherein a through opening is defined in a portion of the pick up cap adjacent a rear of each latch.

5. The electrical connector assembly as claimed in claim 1, wherein a T-shaped channel is defined in a middle of a rear end of the pick up cap, thereby forming a pair of opposing arms.

6. The electrical connector assembly as claimed in claim 1, wherein a pair of latches is formed at the rear end of the pick up cap, the latches depending from free ends of the arms respectively and snappingly clasping a corresponding edge of the clip of the connector.

7. The electrical connector assembly as claimed in claim 1, wherein a pair of protrusions is formed at opposite sides of a rear end of the pick up cap respectively, the protrusions depending from the bottom surface and abutting against a corresponding edge of the clip.

8. A pick up cap mounted onto an electrical connector for providing a plane surface to be engaged by a vacuum suction device, the pick up cap comprising:
    a planar body comprising a bottom surface opposite to the plane surface, at least one passage defined in and through the planar body, said at least one passage extending aslant from the top surface to the bottom surface; and
    a plurality of latches formed at sides of the planar body, the latches capable of catching the connector to mount the pick up cap on the connector;
    wherein a bottom opening of said passage is located closer to a center portion of the pick up can than a top opening of the passage.

9. The pick up cap as claimed in claim 8, wherein two pairs of parallel passages are defined in two opposite sides of the planar body.

10. The pick up cap as claimed in claim 9, wherein a pair of latches is formed at opposite sides of a front end of the pick up cap, and a pair of latches is formed at the rear end of the pick up cap.

11. An electrical connector assembly comprising:
    an electrical connector adapted for being mounted onto a circuit substrate by surface mount technology (SMT), the connector comprising:
    an insulative housing with a plurality of electrical contacts therein; and
    a pick up cap detachably mounted to a top portion of the connector, the pick up cap having a planar body, the planar body having a planar top surface capable of being engaged by a vacuum suction device and a bottom surface, and at least one passage defined in and through the planar body between said top surface and said bottom surface, said at least one passage defining a bottom opening and a top opening respectively in the bottom surface and the top surface, wherein said at least one passage is not of a vertical type relative to the planar body under a condition that the bottom opening and the top opening are not aligned with each other in a vertical direction perpendicular to the top surface;

wherein said passage is essentially constantly communicative to an exterior above said top opening without blocking so as to assure air flows between the passage and the exterior.

12. The assembly as claimed in claim 11, wherein said bottom opening is located closer to a center portion of the pick up cap than the top opening.

13. The assembly as claimed in claim 11, wherein said at least one passage extends aslant relative to the planar body.

14. The assembly as claimed in claim 11, wherein a length along a path of said passage is larger than a thickness of the planar body defined between the top surface and the bottom surface.

15. The assembly as claimed in claim 11, wherein the top opening is located around a periphery region of the pick up cap rather than a center region of the pick up cap so as not to jeopardize a vacuum suction effect thereof.

16. A pick up cap mounted onto an electrical connector for providing a plane surface to be engaged by a vacuum suction device, the pick up cap comprising:

a planar body comprising a bottom surface opposite to the plane surface, at least one passage defined in and through the planar body, said at least one passage defining a top opening in the top surface and a bottom opening in the bottom surface; and at least one latch extending from the planar body for catching the connector;

wherein the top opening and the bottom opening are not aligned with each other in a vertical direction perpendicular to said planar body; wherein the top opening and the bottom opening are permanently communicative to each other without blocking so as to assure air flows in said passage.

17. The pick up cap as claimed in claim 16, wherein a length along a path of said passage is larger than a thickness of the planar body defined between the top surface and the bottom surface.

18. The pick up cap as claimed in claim 16, wherein the top opening is located around a periphery region of the pick up cap rater than a center region of the pick up cap so as not to jeopardize a vacuum suction effect thereof.

* * * * *